United States Patent [19]
Satoh

[11] Patent Number: 5,253,279
[45] Date of Patent: Oct. 12, 1993

[54] SEMICONDUCTOR INTEGRATED CIRCUIT HAVING A BUILT-IN PROGRAMMABLE DIVIDER

[75] Inventor: Fumio Satoh, Itami, Japan

[73] Assignee: Mitsubishi Denki Kabushiki Kaisha, Tokyo, Japan

[21] Appl. No.: 767,430

[22] Filed: Sep. 30, 1991

[30] Foreign Application Priority Data

Oct. 9, 1990 [JP] Japan .................. 2-272633

[51] Int. Cl.$^5$ .................. H03K 21/02; H03K 21/38
[52] U.S. Cl. .................. 377/110; 377/111; 377/121; 307/448
[58] Field of Search .............. 377/73, 74, 110, 111, 377/52, 56, 121; 307/443, 445, 448; 357/41

[56] References Cited

U.S. PATENT DOCUMENTS

| | | | |
|---|---|---|---|
| 3,976,946 | 8/1976 | Schroder | 377/48 |
| 4,331,926 | 5/1982 | Minakuchi | 377/110 |
| 4,525,851 | 6/1985 | Smith et al. | 377/111 |
| 4,855,622 | 8/1989 | Johnson | 307/443 |
| 4,902,909 | 2/1990 | Chantepie | 377/121 |
| 4,947,411 | 8/1990 | Shiraishi et al. | 377/47 |
| 5,084,907 | 1/1992 | Maemura | 377/56 |

FOREIGN PATENT DOCUMENTS 2344036 3/1975 Fed. Rep. of Germany.
2049245 12/1980 United Kingdom.

*Primary Examiner*—John S. Heyman
*Attorney, Agent, or Firm*—Oblon, Spivak, McClelland, Maier & Neustadt

[57] ABSTRACT

A semiconductor integrated circuit includes an input terminal provided for each of input terminals. The input circuit outputs either one of "HIGH" or "LOW" as a frequency dividing ratio setting signal when the corresponding input terminal is "HIGH" or "LOW" in level but outputs another one of "HIGH" and "LOW" as a frequency dividing ratio setting signal when the corresponding input terminal is in an open state. Thus, the frequency dividing ratio of the programmable divider is determined, by fixing the level of only required ones of the input terminals into "HIGH" or "LOW" through, for example, wire bonding in the package while leaving all the others in open state.

12 Claims, 8 Drawing Sheets

SEMICONDUCTOR INTEGRATED CIRCUIT HAVING A BUILT-IN PROGRAMMABLE DIVIDER

BACKGROUND OF THE INVENTION

1. Field of the Invention

The present invention relates to a semiconductor integrated circuit with a built-in programmable divider.

2. Description of the Prior Art

As for a prior art semiconductor integrated circuit with a built-in programmable divider, well-known is a semiconductor integrated circuit which compares phases of a frequency divided signal obtained by dividing an external input signal and a reference signal in order to output a phase difference comparison signal (referred to as "PLL semiconductor integrated circuit" hereinafter).

FIG. 12 is a block diagram showing a system architecture of a first half portion of a prior art television receiver which employs a PLL semiconductor integrated circuit 1. A signal of a desired channel in television signals received by an antenna 15 is amplified by a high-frequency amplifying circuit 14, and after it is converted into an intermediate-frequency signal by a mixer 16, the signal is amplified by an intermediate-frequency amplifying circuit 17 and outputted to the following stage. The mixer 16 receives an output signal of a voltage control oscillator 12 in a PLL circuit 11 as a local oscillation signal. In the PLL circuit 11, a closed loop is composed of the voltage control oscillator 12, the PLL semiconductor integrated circuit 1 and a low-pass filter 13; thereby a frequency of an output signal of the voltage control oscillator 12 is fixed.

The PLL semiconductor integrated circuit 1 includes, as shown in FIG. 13, a programmable divider 2 and a phase comparator 3. An output signal of the voltage control oscillator 12 is applied through an input terminal P1 to the programmable divider 2. The programmable divider 2 divides the frequency of the output signal of the voltage control oscillator 12 with a frequency dividing ratio determined in accordance with a command from an external device 20, such as a computer and the like, to output a frequency divided signal. The phase comparator 3 compares the frequency divided signal with a reference signal applied through an input terminal P2 in phase to output the resultant comparison signal through an output terminal P3 to the low-pass filter 13. Reference symbols, $V_{DD}$ and GND, denote a supply voltage applying terminal and a ground terminal, respectively.

The frequency dividing ratio employed in the programmable divider 2 is determined as follows: First, an enable signal "HIGH" is inputted through an enable terminal P4 from the external device 20; and then, a clock signal and data for determining a frequency dividing ratio are inputted through a clock input terminal P5 and a data input terminal P6, respectively. The shift register 8 sequentially reads data for determining a frequency dividing ratio in accordance with the fall of the clock signal and transfers the data for determining a frequency dividing ratio to a data latch circuit 7 in parallel. When the enable signal from the enable terminal P4 turns to "LOW", the data latch circuit 7 latches the data for determining a frequency dividing ratio at the last transition to apply the data to the programmable divider 2; in accordance with the data for determining a frequency dividing ratio, the programmable divider 2 determines a frequency dividing ratio.

Although the PLL circuit 11 in the television receiver has been described, PLL circuits employed in a transmitter and receiver of a telephone of an automobile or a cordless telephone, a transponder for satellite communication and the like are also similar in system architecture for the purpose of keeping constant frequency and phase of an output of the voltage control oscillator 12.

The prior art PLL semiconductor integrated circuit is structured as previously mentioned, where the shift register 8 and data latch circuit 7 and the enable terminal P4, clock input terminal P5 and data input terminal P6 for inputting data to them are essential for determining a frequency dividing ratio in the programmable divider 2.

As for the transponder for satellite communication and the like, however, a proposition is made that silicon, which is a general semiconductor material, should be replaced with compound semiconductor to make the PLL semiconductor integrated circuit 1. In this case, since the compound semiconductor is expensive, it is desirable that the PLL semiconductor integrated circuit 1 is miniaturized as much as possible to reduce the price. In the prior art PLL semiconductor integrated circuit 1 as shown in FIG. 13, however, a miniaturization is difficult because the shift register 8, data latch circuit 7, enable terminal P4, clock input terminal P5 and data input terminal P6 are essential.

SUMMARY OF THE INVENTION

According to the present invention, a semiconductor integrated circuit comprises a first input terminal formed on a semiconductor chip for receiving an external signal to be frequency-divided, a plurality of second input terminals formed on the semiconductor chip for use in externally determining a frequency dividing ratio, an input circuit provided for each of the second input terminals on the semiconductor chip for providing either one of "HIGH" and "LOW" as a frequency dividing ratio setting signal when the corresponding second input terminal is "HIGH" or "LOW" in level but providing another one of "HIGH" and "LOW" as the frequency dividing ratio setting signal when the corresponding second input terminal is in an open state, and a programmable divider formed on the semiconductor chip for dividing a frequency of the external signal received from the first input terminal with a frequency dividing ratio in accordance with the frequency dividing ratio setting signal received from the input circuit.

According to the present invention, the input circuit is provided for each of second input terminals formed on a semiconductor chip for determining a frequency dividing ratio from the outside. By the input circuit, either one of "HIGH" and "LOW" as a frequency dividing ratio setting signal when the corresponding second input terminal is "HIGH" or "LOW" in level but the other one of "HIGH" and "LOW" when the corresponding second input terminal is in an open state is led out to determine the frequency dividing ratio of the programmable divider in accordance with the frequency dividing ratio setting signal. Thus, in order to obtain the desired frequency dividing ratio, simply the required ones of the second input terminals should be fixed "HIGH" or "LOW" in level while all the others should be left in an open state. In this way, in packaging a semiconductor chip, the frequency dividing ratio can be set to the desired value by a wire bonding in the package without being provided with lead for setting a frequency dividing ratio. As a result, the package can be miniaturized. Moreover, since there is no need of using a shift register and a data latch circuit for applying bits of frequency dividing ratio determining signal, only a small area of the chip is required; this is effective in that the cost is greatly reduced especially when an expensive compound semiconductor chip is employed.

Accordingly, it is an object of the present invention to provide a semiconductor integrated circuit which includes a built-in programmable divider and is easily miniaturized.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
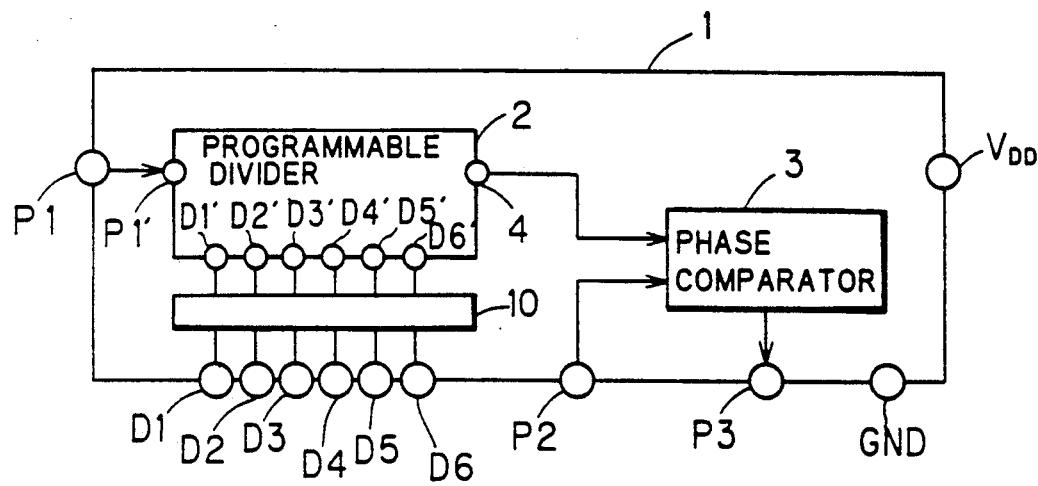
FIG. 1 is a block diagram showing an embodiment of a semiconductor integrated circuit according to the present invention.

FIG. 1 is a block diagram showing a PLL semiconductor integrated circuit 1 which is an embodiment of a semiconductor integrated circuit according to the present invention. The PLL semiconductor integrated circuit 1 includes a programmable divider 2 and a phase comparator 3 both of which are formed on the identical semiconductor chip.

Figure 12:
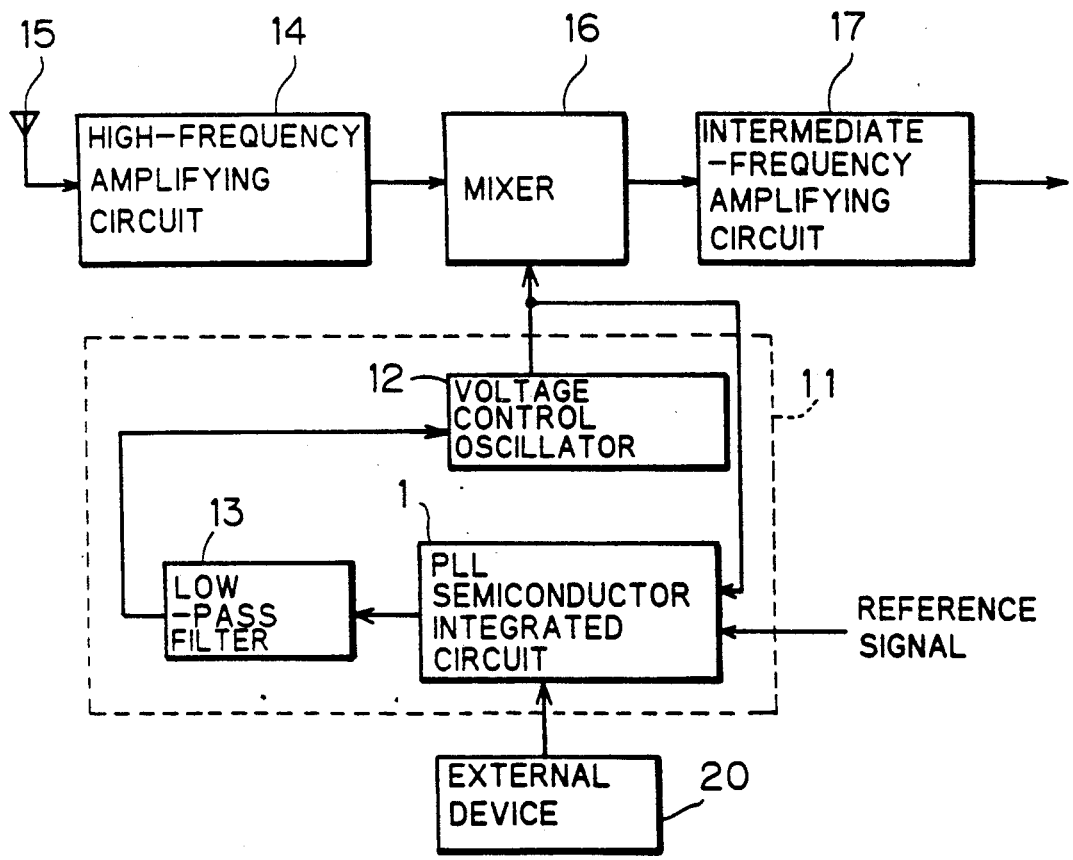
FIG. 12 is a block diagram showing a system architecture of a first half portion of a conventional television receiver.

An output signal of a voltage control oscillator 12 in FIG. 12 is inputted through an input terminal P1 of the PLL semiconductor integrated circuit 1 to an input terminal P1' of the programmable divider 2. The programmable divider 2 divides an inputted signal to output a frequency divided signal to an output terminal 4. The frequency divided signal is applied to one of inputs of the phase comparator 3. To the other input of the phase comparator 3, a reference signal inputted through an input terminal P2 of the PLL semiconductor integrated circuit 1 is applied. The phase comparator 3 compares the signals of both the inputs in phase to output a signal in accordance with a phase difference between them. The signal in accordance with the phase difference is outputted through an output terminal P3 of the PLL semiconductor integrated circuit 1 to the outside and applied to the low-pass filter shown in FIG. 12. Reference symbols, $V_{DD}$ and GND, denote a supply voltage applying terminal and a ground terminal, respectively.

The PLL semiconductor integrated circuit 1 is provided with a plurality (6-bit in FIG. 1) of input terminals D1 through D6 for determining or setting a frequency dividing ratio. The input terminals D1 through D6 are connected through an input circuit 10 formed on the same semiconductor chip as the programmable divider 2 and phase comparator 3 to input terminals D1' through D6' of the programmable divider 2, respectively.

The terminals P1 through P3, D1 through D6, and $V_{DD}$ and GND of the PLL semiconductor integrated circuit 1 may be pads provided on the semiconductor chip of the integrated circuit 1.

The frequency dividing ratio in the programmable divider 2 is determined or set by applying frequency dividing ratio determining (or setting) signals, each of which is "HIGH" or "LOW", through the input terminals D1-D6 and input circuit 10 of the PLL semiconductor integrated circuit 1 to the input terminals D1'-D6' of the programmable divider 2. The contents of the 6-bit frequency dividing ratio determining signals applied to the input terminals D1'-D6' determine the frequency dividing ratio in the programmable divider 2. The input circuit 10 outputs the frequency dividing ration determining signals, each of which is "HIGH" or "LOW", to their respective mated input terminals D1'-D6' of the programmable divider 2 in accordance with the states of the input terminal D1-D6 of the PLL semiconductor integrated circuit 1.

Figure 2:
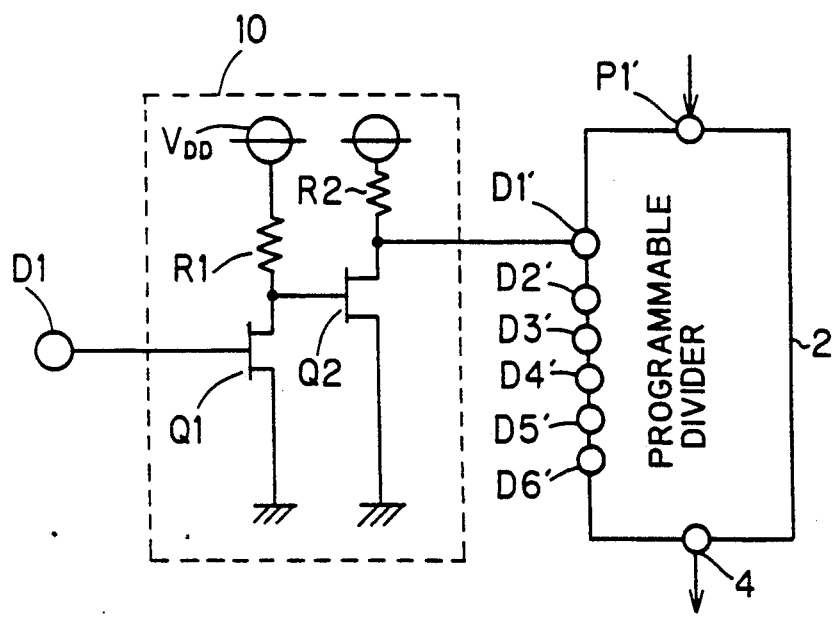
FIG. 2 is a circuit diagram showing an example of an input circuit.

FIG. 2 is a circuit diagram showing an example of a structure of the input circuit 10. In this example, the input circuit 10 has an inverter circuit consisting of a GaAs MESFET (Metal Semiconductor Field Effect Transistor) Q1 and a resistor R1 connected in series between the supply voltage $V_{DD}$ and the ground and another inverter circuit consisting of a GaAs MESTET Q2 and a resistor R2 connected in series between the supply voltage $V_{DD}$ and the ground, where both of the inverter circuits are connected in series. Although FIG. 2 shows the 1-bit input circuit 10 alone which is correlated with the input terminals D1 and D1', the input circuits 10 of other bits are similar in structure.

In the input circuit 10 shown in FIG. 2, when "HIGH" is inputted to the input terminal D1 of the PLL semiconductor integrated circuit 1, a frequency dividing ratio determining signal "HIGH" is also applied to the input terminal D1' of the programmable divider 2; when "LOW" is inputted to the input terminal D1, a frequency dividing ratio determining signal "LOW" is also applied to the input terminal D1'. This is the case similar to the other input terminals D2-D6 and D2'-D6'.

Figure 3:
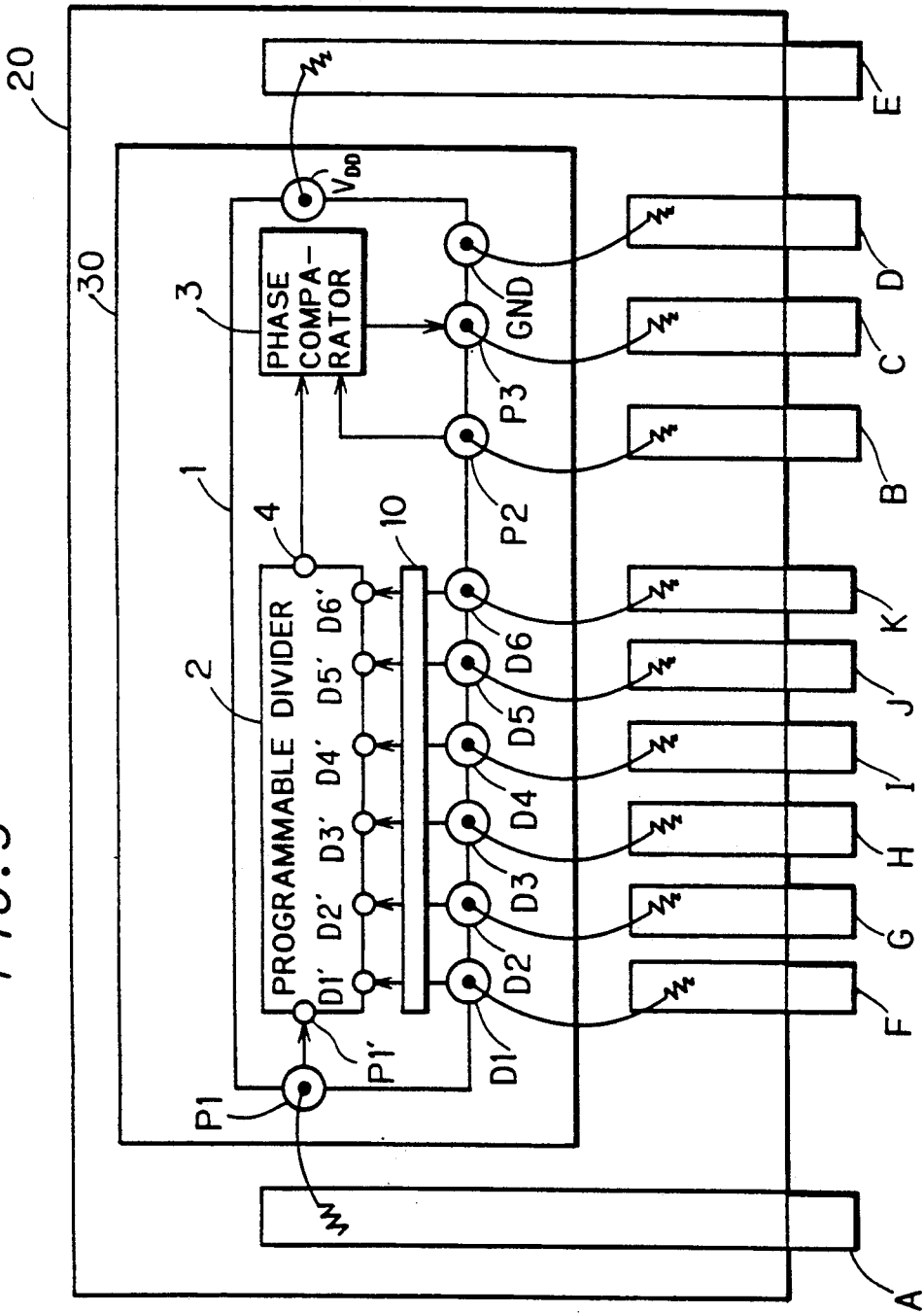
FIG. 3 is a diagram showing a state where a semiconductor integrated circuit having the input circuit in FIG. 2 is packaged.

FIG. 3 is a diagram showing a state where the PLL semiconductor integrated circuit 1 having the input circuit 10 in FIG. 2 is sealed in a package 20. The chip of the PLL semiconductor integrated circuit 1 is fixed, for example, through solder on a metal die pad 30. The terminals (pads), P1-P3, GND, $V_{DD}$, D1-D6, of the PLL semiconductor integrated circuit 1 are connected to leads A-K by wire bonding. An input signal and a reference signal are applied to the leads A and B, respectively, while a phase comparison signal is outputted by the lead C. The ground potential and the supply potential are applied to the leads D and E, respectively. The leads F-K are used to determine a frequency dividing ratio in the programmable divider 2, and they are connected to the supply potential when the level "HIGH" should be applied to the input terminals D1'-D6' of the programmable divider 2 but are connected to the ground potential when the level "LOW" should be applied to them.

Figure 13:
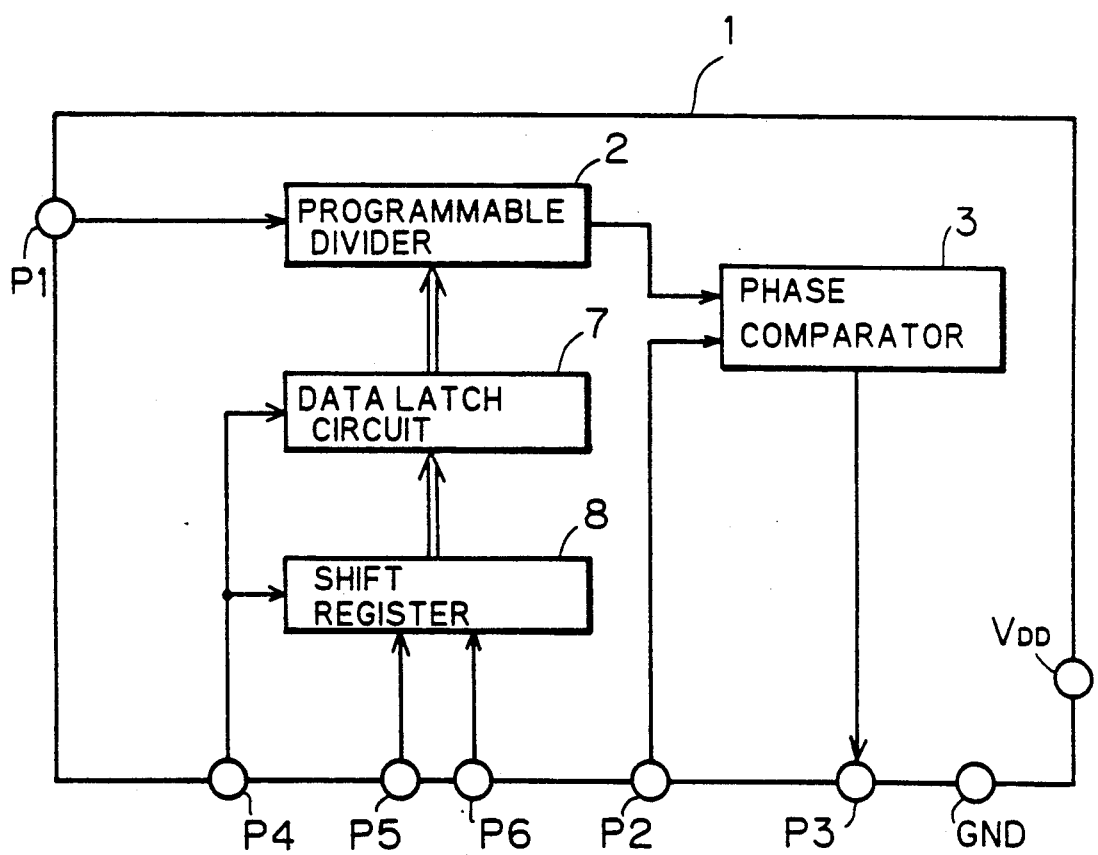
FIG. 13 is a block diagram showing a prior art semiconductor integrated circuit.

A structure shown in FIG. 3 does not comprise the data latch circuit 7 and the shift register 8 as shown in FIG. 13, and accordingly, a chip area of the PLL semiconductor integrated circuit 1 can be reduced. However, the PLL semiconductor integrated circuit 1 must be provided with the leads F-K of the same number as that of the input terminals D1'-D6' for determining a frequency dividing ratio in the programmable divider 2, and this is undesirable because the number of leads increases.

Figure 4:
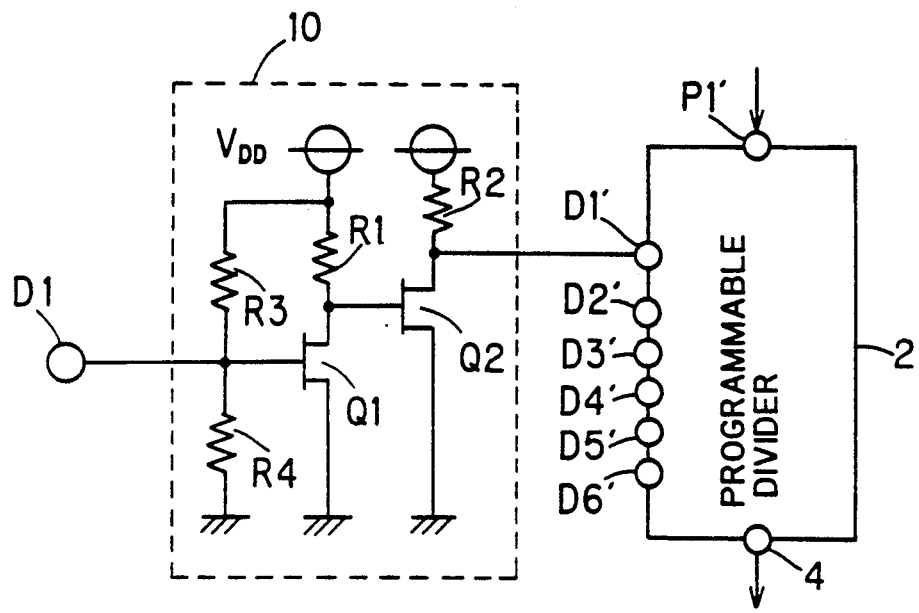
FIG. 4 is a circuit diagram showing another example of the input circuit.

FIG. 4 is a circuit diagram showing another example of a structure of the input circuit 10. The input circuit 10 has resistors R3, R4 for self-biasing connected to a gate of a GaAs MESFET Q1 of the input circuit 10 in FIG. 2. The resistor R3 is connected between the gate of the transistor Q1 and the supply voltage $V_{DD}$ while the resistor R4 is connected between the gate of the transistor Q1 and the ground. The resistors R3, R4 have high resistor values which make flowing current substantially almost negligible; the partial potential ratio is determined so that sufficient voltage to make the transistor Q1 conductive is supplied to the gate of the transistor Q1.

In the input circuit 10 in FIG. 4, when the input terminal D1 of the PLL semiconductor integrated circuit 1 is in an open state, the transistor Q1 is conductive because of a self-bias of the resistors R3, R4, and accordingly, the transistor Q2 for buffering a frequency dividing ratio determining signal is not conductive; thus, a frequency dividing ratio determining signal "HIGH" is applied to the input terminal D1' of the programmable divider 2. On the other hand, when a signal "LOW" is applied to the input terminal D1 of the PLL semiconductor integrated circuit 1, the transistors Q1, Q2 become non-conductive and conductive, respectively, and a frequency dividing ratio determining signal "LOW" is applied to the input terminal D1' of the programmable divider 2. This is the case similar in the other input terminals D2-D6 and D2'-D6'.

Figure 5:
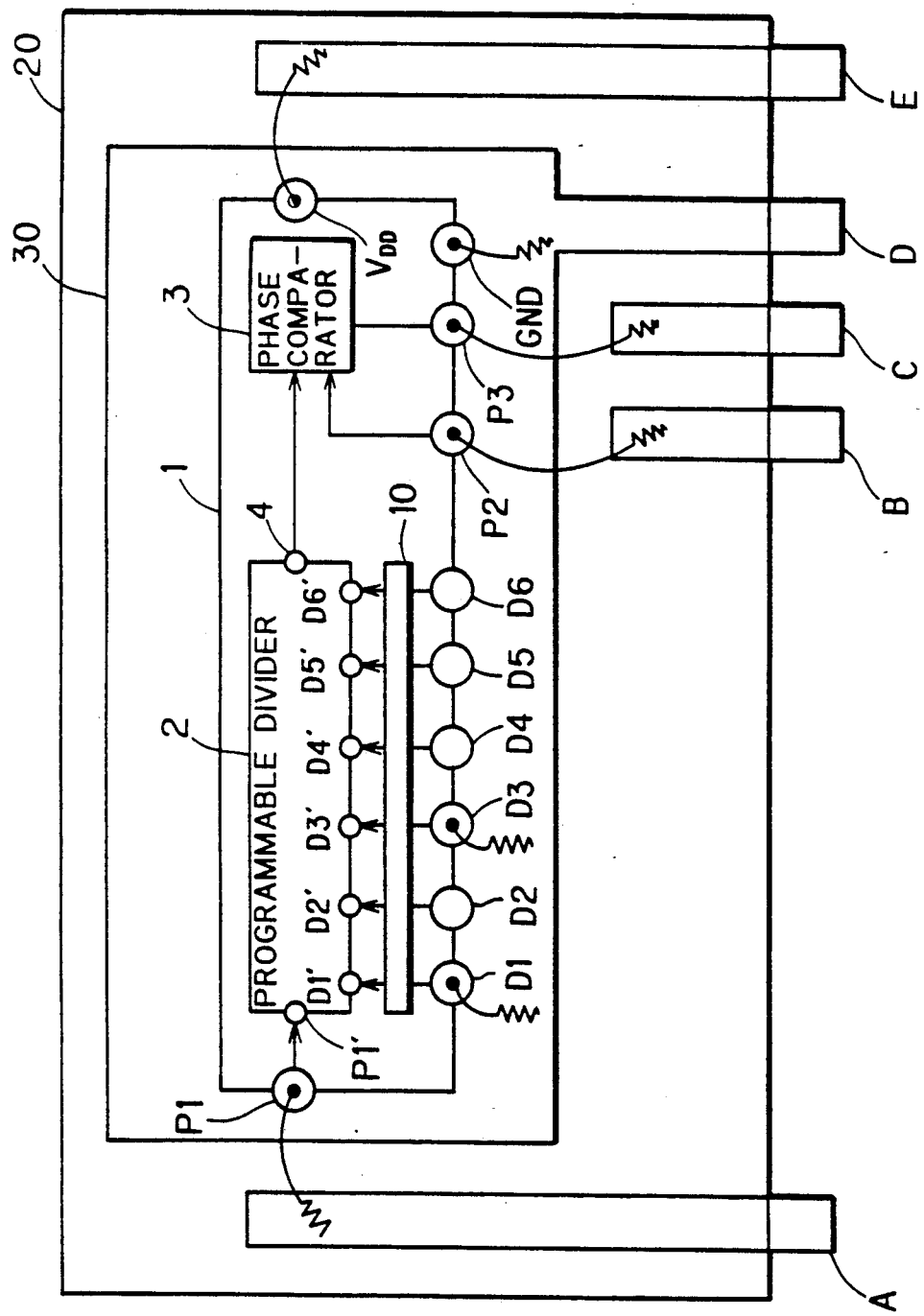
FIG. 5 is a diagram showing a state where a semiconductor integrated circuit having the input circuit in FIG. 4 is packaged.

FIG. 5 is a diagram showing a state where the PLL semiconductor integrated circuit 1 having the input circuit 10 in FIG. 4 is sealed in a package 20. The leads F-K for determining a frequency dividing ratio, which are necessary in the structure shown in FIG. 3, are unnecessary. The die pad 30 is connected to the lead D for ground potential input so that the ground potential is applied to the die pad 30. The remaining parts of the structure are the same as in FIG. 3.

When it is desirable that frequency dividing ratio determining signals "HIGH" are applied to the input terminals D1'-D6' for determining a frequency dividing ratio in the programmable divider 2, their respective mated input terminals (pads) D1-D6 in the PLL semiconductor integrated circuit 1 may be left unconnected. When it is desirable that the frequency dividing ratio determining signals "LOW" are applied to the input terminals D1'-D6', their respective mated input terminals (pads) D1-D6 may be connected to the die pad 30 by wire bonding. In FIG. 5, the frequency dividing ratio determining signals "LOW" are applied to the input terminals D1' and D3' in the programmable divider 2, while the frequency dividing ratio determining signals "HIGH" are applied to the remaining input terminals D2', D4' through D6'.

A structure shown in FIG. 5 does not comprise the data latch circuit 7 and the shift register 8 as shown in FIG. 13, and accordingly, a chip area of the PLL semiconductor integrated circuit 1 can be reduced. In addition to that, there is no need for providing the leads F through K for determining a frequency dividing ratio in the programmable divider 2; and accordingly, the package can be miniaturized. In manufacturing, advantageously, making a change in the wire bonding of the input terminals (pads) D1-D6 of the PLL semiconductor integrated circuit 1, the frequency dividing ratio of the programmable divider 2 can be arbitrarily determined, so that the products of different frequency dividing ratios can be obtained with the identical chips of the PLL semiconductor integrated circuit 1.

FIGS. 6 through 11 are circuit diagrams showing still other examples of the input circuit 10.

Figure 6:
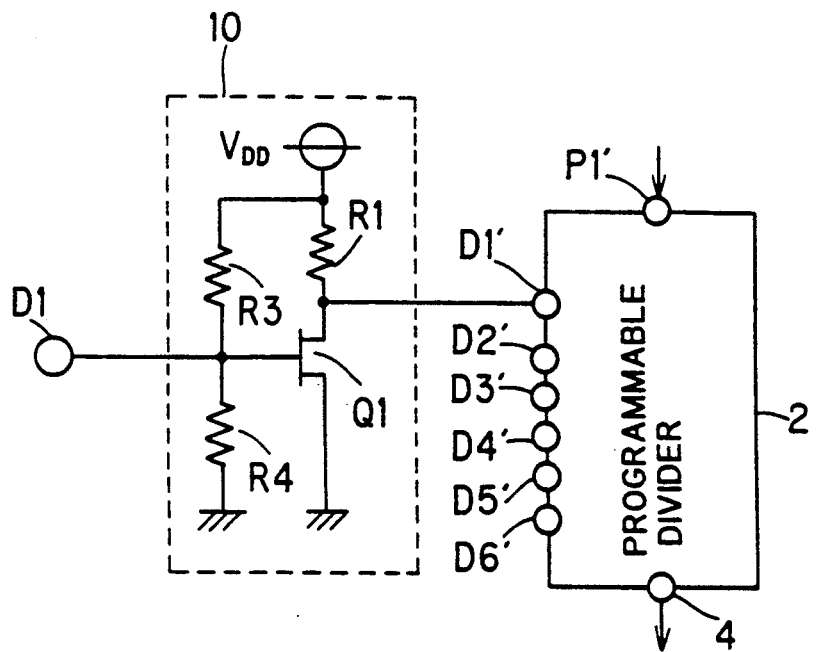
FIGS. 6 through 11 are circuit diagrams showing still other examples of the input circuit.

The input circuit 10 in FIG. 6 has a structure which is the same as that of the input circuit 10 in FIG. 4 except that the inverter circuit consisting of the transistor Q2 and the resistor R2 is omitted. Thus, the input circuit 10 in FIG. 6 is reversed in its input/output logic to the input circuit in FIG. 4. Specifically, when the input terminals D1-D6 in the PLL semiconductor integrated circuit 1 are in an open state, the frequency dividing ratio signals applied to their respective mated input terminals D1'-D6' in the programmable divider 2 are "LOW", while when the input terminals D1-D6 are "LOW", the frequency dividing ratio signals applied to their respective mated input terminals D1'-D6' are "HIGH".

Figure 7:
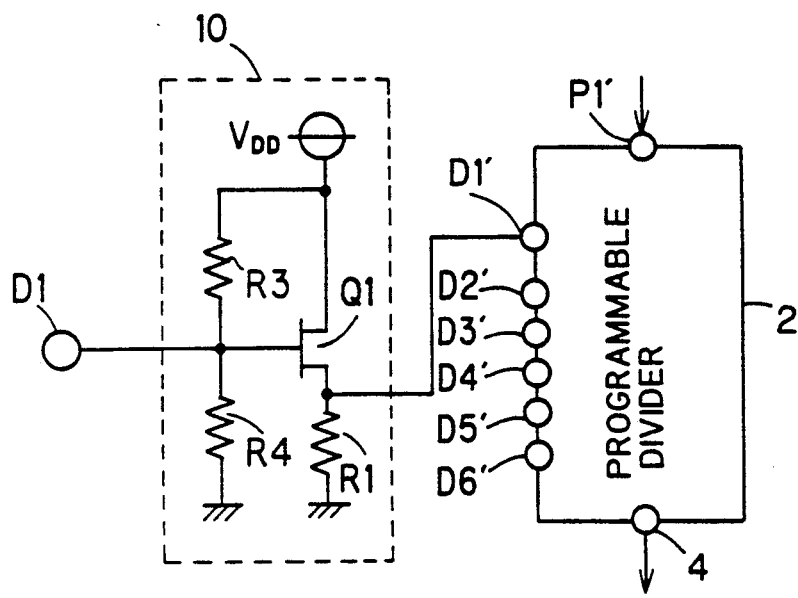

In the input circuit 10 in FIG. 7, a resistor R1 is connected to a source of a GaAs MESFET Q1 while an output is also led out from the source (source follower). Thus, the input circuit 10 in FIG. 7 is reversed in its input/output logic to the input circuit 10 in FIG. 6, that is, identical with the input circuit 10 in FIG. 4.

Figure 8:
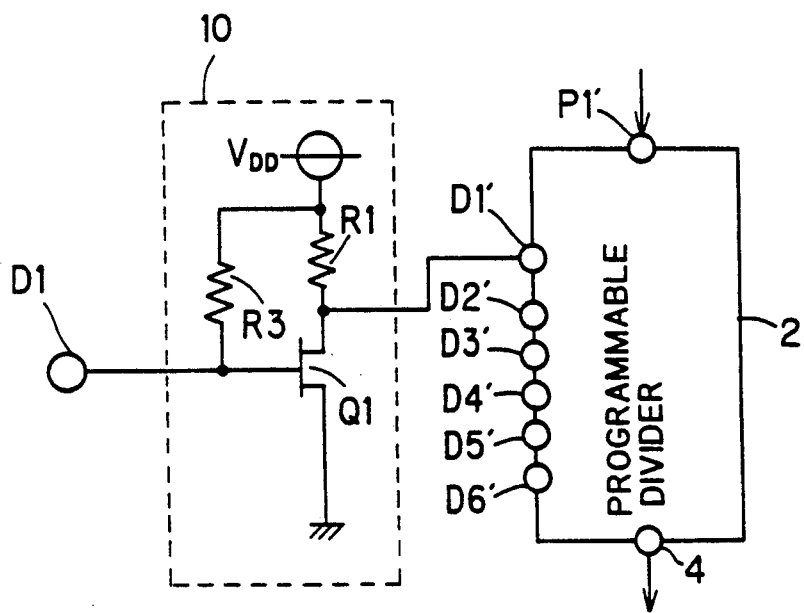

The input circuit 10 in FIG. 8 has a structure which is the same as that of the input circuit 10 in FIG. 6 except that the resistor R4 is omitted. The resistor R3 serves as a pull-up resistor which forces the frequency dividing ratio determining signals applied to the input terminals D1'-D6' to be "LOW" when the input terminals D1-D6 are in an open state. When the input terminals D1-D6 are "LOW", the frequency dividing ratio determining signals applied to their respective mated input terminals D1'-D6' are "HIGH". In other words, the input circuit 10 in FIG. 8 is identical in its input/output logic with the input circuit 10 in FIG. 6.

Figure 9:
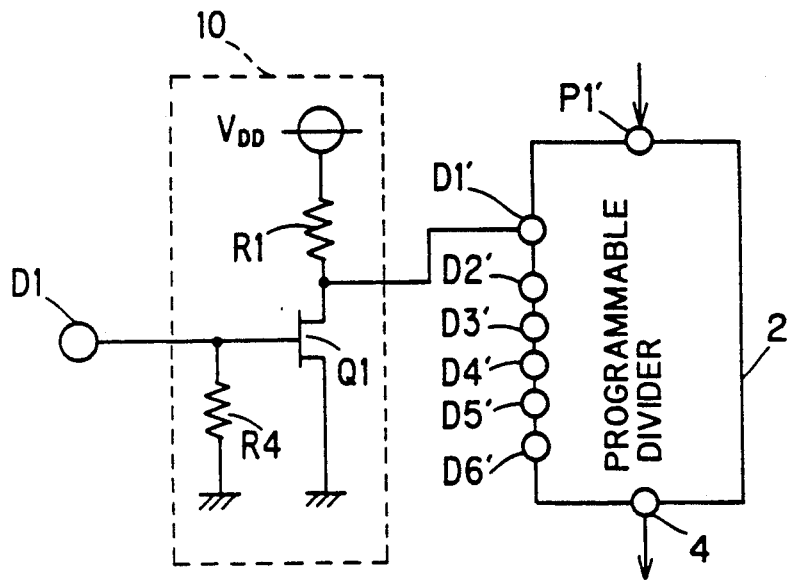

The input circuit 10 in FIG. 9 has a structure which is the same as that of the input circuit 10 in FIG. 6 except that the resistor R3 is omitted. The resistor R4 serves as a pull-down resistor, which forces the frequency dividing ratio determining signals applied to the input terminals D1'-D6' to be "HIGH" when the input terminals D1-D6 are in an open state. To turn the frequency dividing ratio determining signals applied to the input terminals D1'-D6' to "LOW", it is necessary to apply "HIGH" to their respective mated input terminals D1-D6. Thus, in the structure in FIG. 5, the die pad 30 should be connected not to the lead D but to the lead E, and the supply potential should be applied to the die pad 30.

Figure 10:
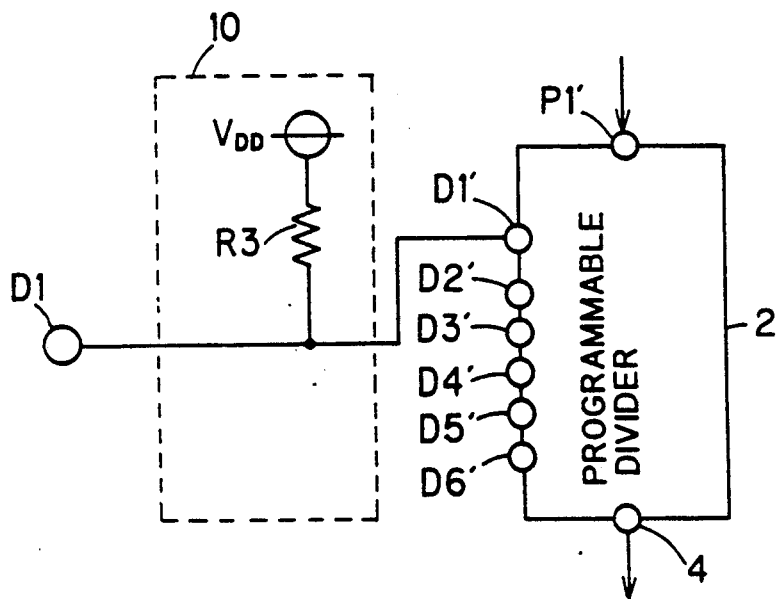

The input circuit 10 in FIG. 10 consists of a pull-up resistor R3 alone. When the input terminals D1-D6 are in an open state, the frequency dividing ratio determining signals applied to their respective mated input terminals D1'-D6' are forced to be "HIGH", while when the input terminals D1-D6 are "LOW", the frequency dividing ratio determining signals applied to their respective mated input terminals D1'-D6' are also "LOW". In other words, the input circuit 10 in FIG. 10 is identical in its input/output logic with the input circuit 10 in FIG. 4.

Figure 11:
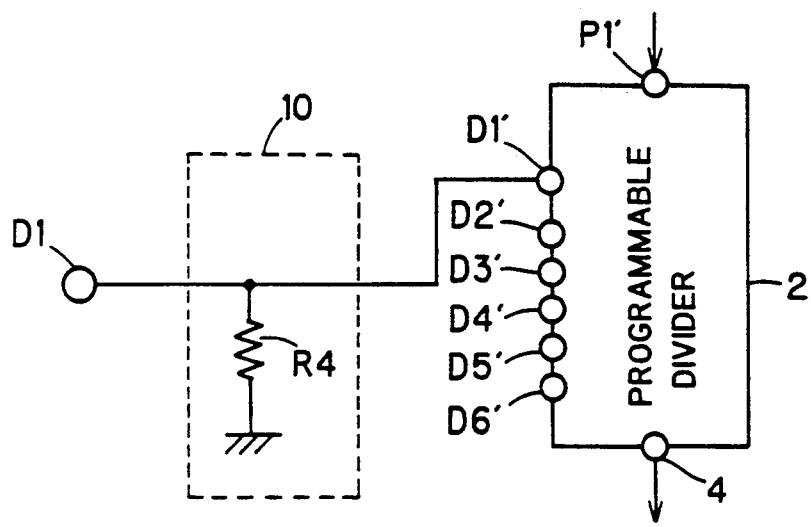

The input circuit 10 in FIG. 11 consists of a pulldown resistor R4 alone. When the input terminals D1-D6 are in an open state, the frequency dividing ratio determining signals applied to their respective mated input terminals D1'-D6' are forced to be "LOW". To turn the frequency dividing ratio determining signals applied to the input terminals D1'-D6' to "HIGH", similar to the case with the input circuit 10 in FIG. 9, "HIGH" must be applied to the input terminals D1-D6.

The structure of the input circuit 10 should not be limited to the above-mentioned structures; any structure may be employed if either one of "HIGH" and "LOW" can be outputted as the frequency dividing ratio determining signals under the levels "H" or "L" of the input terminals D1-D6 but the other one of "HIGH" and "LOW" can be outputted in the situation where one of the input terminals is left in an open state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit, comprising:
   a die pad on which said semiconductor integrated circuit is mounted, said die pad having an external lead connection which supplies a predetermined source potential to said die pad;
   a first input terminal formed on a semiconductor chip for receiving an external signal to be frequency-divided;
   a plurality of second input terminals formed on said semiconductor chip for use in externally determining a frequency dividing ratio;
   a single input circuit connected to each of said second input terminals on said semiconductor chip so as to be provided in a one-to-one correspondence with each of said second input terminals for providing either one of "HIGH" and "LOW" as a frequency dividing ratio setting signal when a corresponding one of said second input terminals is "HIGH" or "LOW" in level but providing another one of "HIGH" and "LOW" as said frequency dividing ratio setting signal when said corresponding second input terminal is in an open state;
   a programmable divider formed on said semiconductor chip for dividing a frequency of said external signal received from said first input terminal with a frequency dividing ratio in accordance with said frequency dividing ratio setting signal received from said input circuit, wherein a predetermined number of said second input terminals are connected to said die pad by wire bonding and a remainder of said second input terminals are left in an open state without connection to said die pad or any external terminals.

2. A semiconductor integrated circuit in accordance with claim 1, wherein
   said input circuit comprises:
   first and second power supply terminals;
   a first transistor having first and second electrodes coupled with said first and second power supply terminals, respectively, and a control electrode coupled with said corresponding second input terminal, which is controlled in its conduction in response to said "HIGH" or "LOW" level of said corresponding second input terminal to derive said frequency dividing ratio setting signal from said first electrode; and
   a self-biasing circuit coupled with said control electrode of said first transistor for biasing said control electrode of said first transistor to force said first transistor into a conducting or nonconducting state when said corresponding second input terminal is in an open state.

3. A semiconductor integrated circuit in accordance with claim 2, wherein
   said input circuit further comprises a second transistor having first and second electrodes coupled with said first and second power supply terminals, respectively, and a control electrode coupled with said first electrode of said first transistor, for buffering and outputting said frequency dividing ratio setting signal.

4. A semiconductor integrated circuit in accordance with claim 2, wherein
   said input circuit further comprises a resistor connected between said first power supply terminal and said first electrode of said first transistor.

5. A semiconductor integrated circuit in accordance with claim 2, wherein
   said self-biasing circuit comprises a first resistor connected between said first power supply terminal and said control electrode of said first transistor.

6. A semiconductor integrated circuit in accordance with claim 5, wherein
   said self-biasing circuit further comprises a second resistor connected between said second power supply terminal and said control electrode of said first transistor.

7. A semiconductor integrated circuit in accordance with claim 1, wherein
   said input circuit comprises:
   a signal line connected between corresponding said second input terminal and said programmable divider for applying said "HIGH" or "LOW" level of said corresponding second input terminal to said programmable divider as said frequency dividing ratio setting signal; and
   a resistor connected between said signal line and a power supply terminal.

8. A semiconductor integrated circuit in accordance with claim 7, wherein
   said resistor is a pull-down resistor.

9. A semiconductor integrated circuit in accordance with claim 7, wherein
   said resistor is a pull-up resistor.

10. A semiconductor integrated circuit in accordance with claim 2, wherein
    said first transistor is a GaAs MESFET.

11. A semiconductor integrated circuit in accordance with claim 3, wherein
    said second transistor is a GaAs MESFET.

12. A semiconductor integrated circuit in accordance with claim 1, further comprising
    a third input terminal for inputting a reference signal; and
    a phase comparator for comparing phases of a frequency divided signal outputted from said programmable divider with said reference signal to output a resultant phase difference comparison signal.

* * * * *